United States Patent [19]

Ferraris

[11] 4,226,932
[45] Oct. 7, 1980

[54] TITANIUM NITRIDE AS ONE LAYER OF A MULTI-LAYERED COATING INTENDED TO BE ETCHED

[75] Inventor: Giampiero Ferraris, Milan, Italy

[73] Assignee: GTE Automatic Electric Laboratories Incorporated, Northlake, Ill.

[21] Appl. No.: 54,750

[22] Filed: Jul. 5, 1979

[51] Int. Cl.$^3$ .................... B05D 5/12; B32B 7/00; B23C 15/00; C23F 1/02
[52] U.S. Cl. .................... 430/312; 156/652; 156/656; 156/659.1; 156/661.1; 174/68.5; 204/192 C; 427/34; 427/96; 427/99; 427/125; 427/423; 427/419.7; 428/432; 428/450; 428/472; 428/623; 428/627; 428/670; 428/672; 428/931; 430/316; 430/318
[58] Field of Search ............... 174/68.5; 204/192 C; 427/34, 96, 99, 125, 423; 428/432, 450, 472, 901, 627, 670, 672, 623; 430/312, 316, 318; 156/652, 656, 659, 661

[56] References Cited

U.S. PATENT DOCUMENTS

| | | | |
|---|---|---|---|
| 3,406,043 | 10/1968 | Bolde | 428/472 |
| 3,479,237 | 11/1969 | Bergh et al. | 430/416 |
| 3,495,959 | 2/1970 | Johnsen | 428/472 |
| 3,642,548 | 2/1972 | Eger | 427/96 |
| 3,698,946 | 10/1972 | Kaspaul et al. | 428/472 |
| 3,793,175 | 2/1974 | Joly et al. | 204/192 C |
| 3,807,008 | 4/1974 | Reedy | 428/472 |
| 3,916,075 | 10/1975 | Dimigen | 428/472 |
| 3,997,411 | 12/1976 | Mueny | 427/96 |
| 4,019,168 | 4/1977 | Collins | 427/126 |
| 4,020,222 | 4/1977 | Kausche et al. | 428/472 |
| 4,151,325 | 4/1979 | Welch | 427/126 |
| 4,153,518 | 5/1979 | Holmes et al. | 427/99 |

Primary Examiner—James C. Cannon
Attorney, Agent, or Firm—Greogry G. Hendricks; Robert J. Black

[57] ABSTRACT

A multilayered thin film structure comprising layers of resistive and conductive materials on a substrate, said layers including tantalum nitride, palladium and gold. A layer of titanium nitride, is used between the tantalum nitride and palladium layers to act as an adhesive layer, to prevent undercutting during etching, and to allow all metal depositing to be performed during one step.

8 Claims, 11 Drawing Figures

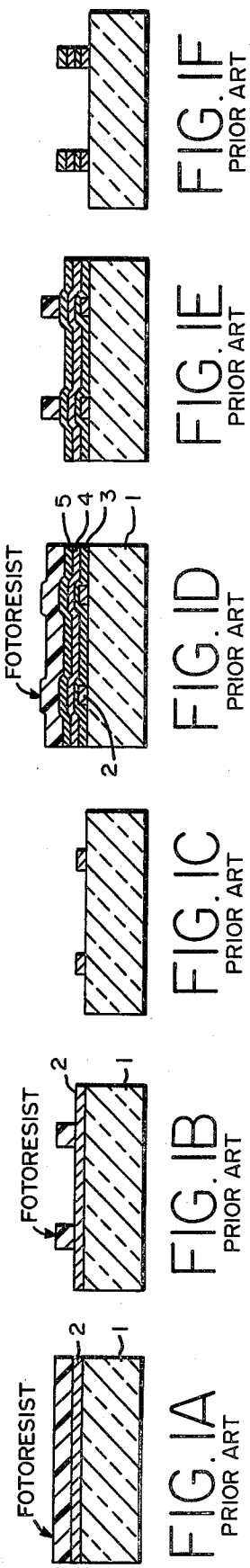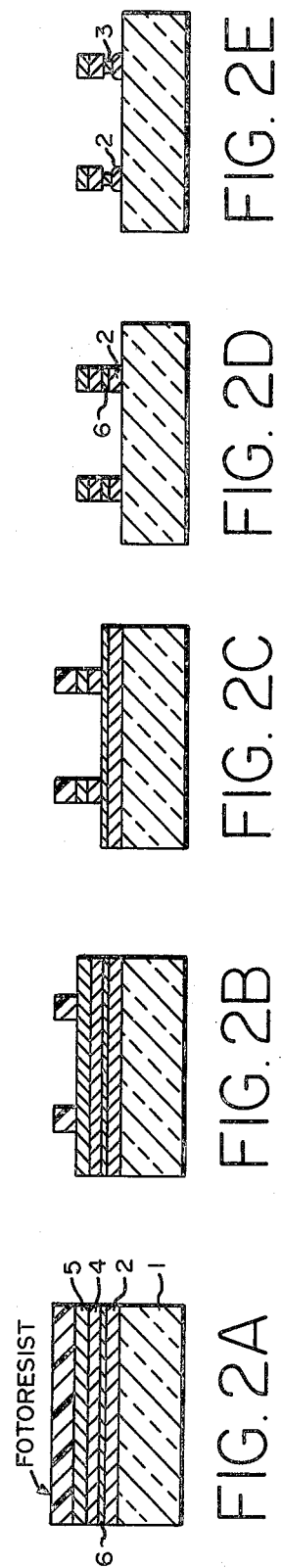

TITANIUM NITRIDE AS ONE LAYER OF A MULTI-LAYERED COATING INTENDED TO BE ETCHED

BACKGROUND OF THE INVENTION (1) Field of the Invention

The present invention relates to microelectronics and more particularly to multilayered thin film structures utilizing a layer of titanium nitride between layers of tantalum nitride and palladium.

(2) Description of the Prior Art

The prior art multilayered thin film structures consist of a suitable substrate (glass, ceramic, etc.) on which four layers consisting of tantalum nitride, titanium, palladium and gold are applied sequentially by deposition. The purpose of the tantalum nitride layer is to provide the resistive elements of the integrated circuit. The titanium layer is used as an adhesive layer, and the palladium layer is used as a barrier against thermal diffusion of titanium into the final gold layer which is used to provide the conductors of the integrated circuit. The desired configurations of the resistors and conductors are obtained by etching the tantalum nitride and gold layers respectively.

The etching is generally accomplished by means of chemical agents. Other methods which could be employed are ion etching or RF back sputtering etching, but these methods require techniques and equipment which are neither simple nor inexpensive and certainly not as economical as chemical etching. However, at the present state of the art no chemical etchants are known that selectively etch tantalum nitride but not titanium. As a result, if no special measures are taken, a dangerous undercutting of the titanium layer occurs in the usual photolithographic process.

In addition, the etchants for tantalum nitride etch titanium at a much higher rate then that at which they etch tantalum nitride, so that for integrated circuit geometries with very small line widths the severe undercutting of the titanium layer can cause the palladium and gold layers to peel off.

In order to avoid this peel-off, the prior art solution is to withdraw the tantalum nitride coated substrate from the vacuum station used in the deposition process; then perform the photolithography of the tantalum nitride and to reintroduce the photo engraved substrate into a second vacuum station. The deposition of titanium, palladium and gold is then performed. The structure is then withdrawn from the second vacuum station and photolithography is performed on the last three layers.

Normally this method requires two vacuum stations to be operating in parallel; one for the tantalum nitride deposition and the other for the titanium, palladium and gold deposition. This two station method is required in order to continuously perform the depositions without interruptions for the intermediate photolithography of the tantalum nitride. However, this method results in contamination of the surface of the tantalum nitride layer because of its exposure to air between the first and second vacuum cycles. This method also doubles the evacuation time. The use of tantalum as a resistive material for thin film resistors is described in Berry, Hall and Harris, *Thin Film Technology*, Princeton, N.J., D. Van Nostrand 1968 p. 341. The use of sequential layers of titanium, palladium and gold as a termination material for thin film resistors is also described in this reference at page 367.

Accordingly, it is an object of the present invention to provide a method of making multilayered thin film structures in a one state evacuation process. It is another object of the present invention to provide a multilayered thin film structure in which the tantalum nitride layer can be etched without undercutting the adhesive layer (titanium in prior art) between the tantalum nitride layer and the palladium layer.

SUMMARY OF THE INVENTION

The present invention is both a multilayered thin film structure and a method of making said structure by means of depositing layers of resistive and conductive materials on a substrate in one evacuation process.

The multilayered thin film structure of the present invention is formed by the steps of depositing on a substrate (glass, ceramic, etc.) in a single vacuum station by means of sequential sputtering deposition, a first layer of tantalum nitride, used as a resistive element, followed by a second layer of titanium nitride, used as an adhesive, and obtained by doping titanium with nitrogen. A third layer of palladium, used as a barrier against thermal diffusion of titanium, is deposited on the titanium nitride layer and a final gold layer, used as a conductive element, is deposited on the palladium layer.

The present invention consists of the novel use of the titanium nitride layer, as an adhesive layer, between the tantalum nitride and palladium layers to prevent undercutting of the titanium nitride layer by the tantalum nitride etchant during the photolithography process. Since titanium nitride is resistant to the tantalum nitride etchant the undercutting effects can be avoided so that it is possible to carry out all of the thin film metal depositions from the tantalum nitride layer to the gold layer in the same vacuum station by means of a sequential sputtering process.

After withdrawal of the structure from the vacuum station, photolithography by means of selective chemical etching of the gold, palladium, titanium nitride and tantalum nitride layers is used to obtain the conductive circuit and a second photolithography step is used by means of selective chemical etching of the gold, palladium and titanium nitride layers to obtain the resistive circuit.

The use of the titanium nitride layer instead of pure titanium is a novel and economic method to prevent the dangerous undercutting of the adhesive layer in the photolithographic stage during which the tantalum nitride layer is etched to obtain the conductive circuit.

DESCRIPTION OF THE DRAWINGS

FIGS. 1A through 1F are sequential diagrams showing the deposition and etching of a multilayered thin film structure in accordance with the prior art.

FIGS. 2A through 2E are sequential diagrams showing the deposition and etching of a multilayered thin film structure in accordance with the present invention.

DESCRIPTION OF THE PREFERRED EMBODIMENT

Referring now to the structure of the prior art FIG. 1A shows a tantalum nitride layer 2 deposited on a substrate 1 (glass, ceramic, etc.). Tantalum nitride is used as the resistive element of the thin film structure. This layer has been deposited under vacuum and is coated with a photoresistive film as shown. In FIG. 1B the structure of FIG. 1A is illustrated after the steps of the photolithographic process, i.e., application of the photoresistive material to the tantalum nitride, exposure to light and removal of the photoresist which has not hardened from the areas which were covered by a mask during exposure. FIG. 1C illustrates the structure after chemical etching, i.e., after completion of the photolithographic process. FIG. 1D shows the multilayered structure after depositing the titanium layer 3, palladium layer 4 and gold layer 5, which have also been deposited by sputtering under vacuum.

The titanium layer is used as an adhesive layer between the tantalum nitride layer and the palladium layer. The palladium layer is used as a barrier against thermal diffusion of titanium into the gold layer which is used as the conductive element of the thin film structure. However, these layers were required to be deposited in a separate evacuation stage from the deposition of the tantalum nitride layer, which was also done under vacuum. This two stage evacuation process is required to prevent the tantalum nitride etchant from undercutting the titanium layer. This step also shows the second application of a photoresistive layer. FIG. 1E shows the prior art multilayered structure after exposure to light and removal of the non-hardened photoresist and FIG. 1F shows the finished multilayered structure after completion of the photolithographic process.

Referring now to the structure of the present invention FIG. 2A shows a multilayered structure obtained by depositing on substrate 1 in a single vacuum station by means of sequential deposition, a tantalum nitride layer 2, a titanium nitride layer 6, a palladium layer 4, and a gold layer 5 which is coated, after removal from the station, with a photoresistive layer.

The titanium nitride layer (adhesive layer) is substituted for the pure titanium used in the prior art. By doping titanium with nitrogen, the resultant titanium nitride layer becomes resistant to the tantalum nitride etchant used in the photolithography of the tantalum nitride layer. In this way the undercutting effects caused by the tantalum nitride can be avoided so that it is possible to carry out all of the thin film depositions from the tantalum nitride layer to the gold layer in the same vacuum station by means of a sequential sputtering process.

In FIG. 2B the multilayered structure is shown after exposure to light and removal of the photoresist layer from the non-hardened area. FIG. 2C shows the multilayered structure after selective chemical etching of the gold and palladium layers and FIG. 2D shows the multilayered structure after the further selective chemical etching of the titanium nitride layer 6 and tantalum nitride layer 2.

FIG. 2E shows the multilayered structure which is obtained if non-doped titanium is used. It is noted that a severe undercutting of the titanium layer 3 and a partial undercutting of the tantalum nitride layer 2 results. It is further noted by contrast that FIG. 2D, illustrating the present invention, shows no undercutting of the titanium nitride layer 6 or the tantalum nitride layer 2 when titanium nitride is used as opposed to pure, i.e., non-doped titanium.

The thin film structure of the present invention consists of the sequential vacuum deposition on a substrate, of tantalum nitride followed by titanium nitride, palladium and gold. The novel use of titanium nitride as opposed to pure titanium allows the use of one deposition station for all layers and also prevents undercutting of the titanium layer when tantalum nitride is etched.

The gold layer deposited on the palladium layer can be used both as a conductive layer and, if necessary as an anchoring layer for subsequent selective or total gold electroplating.

The thin film structure obtained by the sequential sputtering method of the present invention results in a multilayer thin film structure which is very resistant to environmental corrosion.

It will be obvious to those skilled in the art that numerous modifications of the present invention can be made without departing from the spirit of the invention which shall be limited only by the scope of the claims appended hereto.

What is claimed is:

1. A multilayered thin film structure for use in hybrid integrated circuits comprising:
   substrate means providing a base for said structure;
   resistive means located on said substrate means;
   an adhesive layer of titanium nitride located on said resistive means;
   thermal diffusion barrier means located on said titanium nitride means;
   conductive means located on said thermal diffusion barrier means;
   said thermal diffusion barrier means functioning to prevent the diffusion of titanium included in said titanium nitride, to said conductive means in response to heat.

2. A multilayered thin film structure as claimed in claim 1, wherein: said resistive means comprise tantalum nitride.

3. A multilayered thin film structure as claimed in claim 1, wherein: said thermal diffusion barrier means comprise palladium.

4. A multilayered thin film structure as claimed in claim 1, wherein: said conductive means comprise gold.

5. A method of making a multilayered thin film structure for use in hybrid integrated circuits, said method comprising:
   a first step of placing a substrate in a vacuum station;
   a second step of depositing on said substrate a layer of tantalum nitride, by means of sequential sputtering deposition;
   a third step of depositing a layer of titanium on said layer of tantalum nitride and doping the titanium layer with nitrogen during sputtering to obtain a layer of titanium nitride;
   a fourth step of depositing on said titanium nitride layer, a layer of palladium; and
   a fifth step of depositing on said palladium layer, a layer of gold.

6. A method of making a multilayered thin film structure as claimed in claim 5, wherein there is further included:
   a sixth step comprising withdrawal of said coated substrate from said vacuum station; and
   a seventh step comprising photolithographing said coated substrate by means of a first selective chemical etching of said gold, palladium, titanium nitride and tantalum nitride layers so as to obtain a conductive circuit.

7. A method of making a multilayered thin film structure as claimed in claim 6, wherein there is further included: an eighth step comprising photolithographing said coated substrate by means of a second selective chemical etching of said gold, palladium and titanium nitride layers to obtain a resistive circuit.

8. A method of making a multilayered thin film structure as claimed in claim 6, wherein: said nitrogen doping is calibrated so as to control the rate of said first etching of said titanium nitride by said chemical etchants used in said photolithographing of said coated substrate.

* * * * *